United States Patent
Filoramo et al.

(10) Patent No.: US 6,812,770 B2
(45) Date of Patent: Nov. 2, 2004

(54) MIXER WITH EXPONENTIALLY VARIABLE GAIN

(75) Inventors: Pietro Filoramo, Syracuse (IT); Angelo Granata, Syracuse (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 10/352,788

(22) Filed: Jan. 28, 2003

(65) Prior Publication Data

US 2003/0169090 A1 Sep. 11, 2003

(30) Foreign Application Priority Data

Jan. 29, 2002 (EP) .............................................. 02425035

(51) Int. Cl.[7] .................................................. G06F 7/44
(52) U.S. Cl. ........................ 327/359; 327/65; 327/563
(58) Field of Search ................................ 327/359, 355, 327/356, 63–65, 563

(56) References Cited

U.S. PATENT DOCUMENTS

| 5,625,307 A | * | 4/1997 | Scheinberg | 327/113 |
|---|---|---|---|---|
| 5,748,027 A | | 5/1998 | Cargill | 327/350 |
| 5,933,771 A | | 8/1999 | Tiller et al. | 455/333 |
| 5,991,612 A | * | 11/1999 | Saito | 455/234.1 |
| 6,684,065 B2 | * | 1/2004 | Bult et al. | 455/252.1 |

* cited by examiner

*Primary Examiner*—Timothy P. Callahan
*Assistant Examiner*—Cassandra Cox
(74) *Attorney, Agent, or Firm*—Lisa K. Jorgenson; Allen, Dyer, Doppelt, Milbrath & Gilchrist, P.A.

(57) ABSTRACT

An exponentially variable gain mixer circuit includes an oscillating circuit generating an alternating differential signal. A correction circuit is connected to the oscillating circuit and includes a first amplifier and a differential amplifier. The first amplifier receives an external gain variation command and generates a differential output signal that includes a control voltage and a bias voltage. The differential amplifier receives the alternating differential signal and generates a differential modulation signal. A variable gain mixer receives an input differential signal and generates an amplified differential signal as a function of the differential modulation signal and the control voltage.

22 Claims, 4 Drawing Sheets

MIXER WITH EXPONENTIALLY VARIABLE GAIN

FIELD OF THE INVENTION

The present invention relates to variable gain mixers, and more precisely, to an exponentially variable gain mixer.

BACKGROUND OF THE INVENTION

A mixer is a circuit that converts the frequency of a signal, and is used in modern transceivers in telecommunication networks. Because of the attenuation to which a transmitted signal may undergo along the path from a transmitter to a receiver, the gain of the receiver needs to be increased to produce a signal having a constant magnitude. Similarly, the transmitter needs to be able to reduce the power of the transmitted signal to make the receiver correctly receive other signals having a relatively small magnitude.

The two functions of modulation and amplification with variable gain may be carried out by two distinct circuits, commonly called a mixer and a variable gain amplifier, respectively, or may be carried out by a single circuit commonly called a variable gain mixer (VGM). The latter approach is often preferred because of reduced current dissipation, enhanced noise immunity and reduced nonlinear distortion. Moreover, input and output signals in a variable gain mixer have different frequencies, and this favors the isolation between the input and the output. This characteristic is particularly important if the VGM needs to significantly attenuate the output signal.

The gain G of the VGM is generally a function of a gain control voltage VG, that is, G=G(VG). Very often an exponential variation law is required in transceiver design in order to have a linear variation of the gain expressed in dB, $G_{dB}=20 \cdot \text{Log}(G)$. To obtain this type of function, the control voltage VG needs to be generated by a circuit with an appropriate transfer characteristic.

One embodiment of the VGM is described in U.S. Pat. No. 5,933,771 to Tiller et al., and is depicted in FIG. 1 herein. The differential current signal ($i_{sig}$, $-i_{sig}$) is the input of a modified version of a so-called Gilbert Cell, formed by the transistors Q1, Q2, Q3 and Q4. The differential current modulates the frequency based upon application of a differential voltage signal (Vlo$^+$, Vlo$^-$) generated by an oscillating circuit.

Assuming that a differential voltage signal has a square waveform, then only two of the four transistors Q1–Q4 are on during every half-period. The final result is a multiplication of the input current $i_{sig}$ by +1 during a half-period, and by −1 during the successive half-period.

The current regulating transistors Q5 and Q6 are identical, and these are driven by the gain control voltage VG. Their function is to shunt part of the current of the input signal ($i_{sig}$, $-i_{sig}$) towards the positive supply Vpos, thus causing an attenuation as a function of the voltage VG. When the voltage VG assumes its minimum value, the transistors Q5 and Q6 are turned off and all the signal current $i_{sig}$ is modulated at the output ($i_{out+}$, $i_{out-}$). On the contrary, when the voltage VG assumes its maximum value, all the signal current flows in transistors Q5 and Q6, and thus there is no output current. In general, the attenuation, that is, the ratio between the output current signal $i_{out}$ and the input current signal $i_{sig}$, may be expressed by the following equation:

$$\frac{i_{out}}{i_{sig}} = \frac{1}{1+e^{\frac{VG-Vlo}{V_T}}} \quad (1)$$

wherein $V_T$ is the thermal voltage. As it may be noted, a drawback of this approach is the fact that the attenuation depends, besides from the voltage VG, but also from the amplitude of the differential signal Vlo, which, in general, is independent from the voltage VG.

In an attempt to solve this problem, the circuit depicted in FIG. 2 has been proposed in the above cited prior art reference. An oscillating circuit 3, comprising a pair of oscillators and a relative bias circuit BIAS_CIRCUIT, generates an alternating differential signal that is input to the variable gain mixer VGM as a differential modulation signal (Vlo$^+$, Vlo$^-$). The peak detector PEAK_DETECTOR included in the correction circuit 2 receives the alternating differential signal and generates the respective peak voltage Vlo.

An externally generated voltage for commanding the variation of the gain VG2 is added to the peak voltage Vlo and to the bias voltage Vb of the oscillators of the circuit 3. In this way, the voltage VG−Vlo, which (see equation (1)) determines the attenuation of the output signal $i_{out}$ with respect to the input signal $i_{sig}$, does not depend anymore from the peak voltage Vlo:

$$VG-Vlo=(VG2+Vb+Vlo)-Vlo=VG2+Vb \quad (2)$$

The drawback of the circuit of FIG. 2 is that it includes a peak detector that introduces delays and adds noise, and could require non-integrable elements.

SUMMARY OF THE INVENTION

An object of the present invention is to provide an exponentially variable gain mixer that has a very straightforward structure, is not affected by the above mentioned noise and delay problems, and does not require the use of a peak detector for its functioning as in the prior art circuits.

This and other objects, advantages and features in accordance with the present invention are provided by an exponentially variable gain mixer comprising a variable gain mixer receiving an input differential signal to be amplified, and producing an amplified differential output signal that is a function of a differential modulation signal and a control voltage. The mixer further comprises an oscillating circuit for generating an alternating differential signal. A correction circuit is input with an external gain variation command, and with the alternating differential signal for producing the differential modulation signal and the control voltage.

Unlike comparable known circuits, the modulator of the invention does not require a peak detector because the correction circuit comprises a first amplifier input with the external gain variation command that generates the control voltage and a bias voltage as a differential output signal. The modulator includes a second differential amplifier, referenced to the bias voltage, and is input with the alternating differential signal and outputs the differential modulation signal.

Preferably, the gain of the first amplifier input with the external command varies proportionally with the operating temperature, thus making transfer characteristics of the mixer substantially independent from the temperature.

According to another embodiment, the modulator of the invention is provided with a compensation circuit for coupling the first amplifier to the second amplifier such that the attenuation may vary exponentially with a very high precision.

BRIEF DESCRIPTION OF THE DRAWINGS

The different features and advantages of the invention will appear even more evident through the following detailed description of several embodiments and by referring to the attached drawings, wherein.

DETAILED DESCRIPTION OF THE PREFERRED EMBODIMENTS

Figure 3:
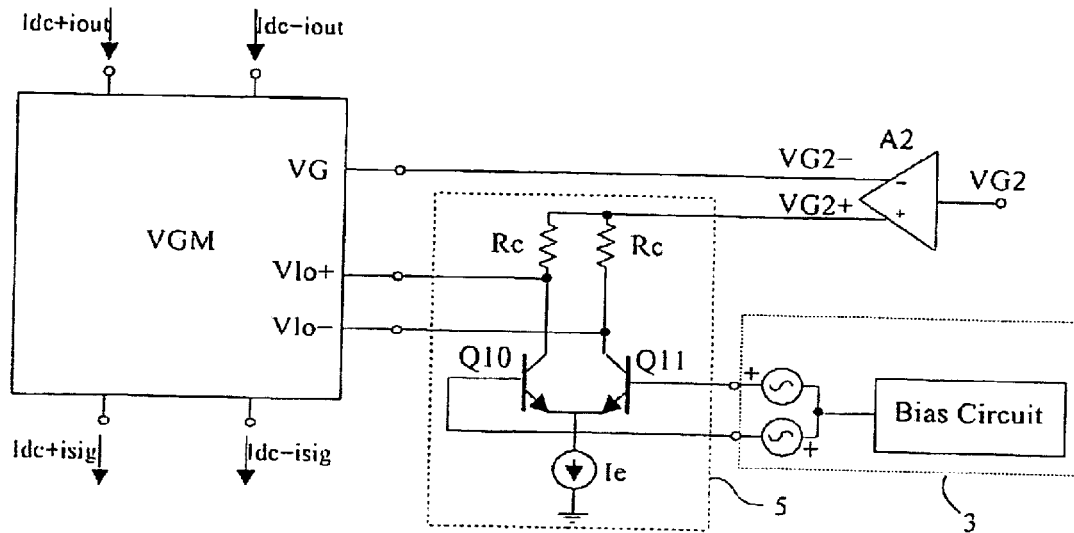
FIG. 3 depicts a variable gain mixer according to the invention, which does not use a peak detector.

A basic diagram of the mixer of the invention is depicted in FIG. 3. The circuit comprises a variable gain mixer VGM coupled to a correction circuit. The correction circuit is substantially formed by a first amplifier A2 and by a second differential amplifier 5. The amplifier A2 is input with the external gain variation command VG2, and generates a control voltage VG2$^-$ and a bias voltage VG2$^+$. The differential amplifier 5, referenced to the bias voltage VG2$^+$, is input with the alternating differential signal generated by the oscillating circuit 3, and generates the differential modulation signal (Vlo$^+$, Vlo$^-$).

This approach allows the differential signal from the local oscillator (Vlo$^+$, Vlo$^-$) to be combined with the differential voltages (VG2$^+$, VG2$^-$) from the first amplifier A2 in a straightforward and efficient way, such that the gain of the VGM does not depend on the peak amplitude Vlo of the signal. Moreover, this result is obtained without using in the correction circuit a peak detector and/or other circuits that cause delays and/or increase noise.

Figure 2:
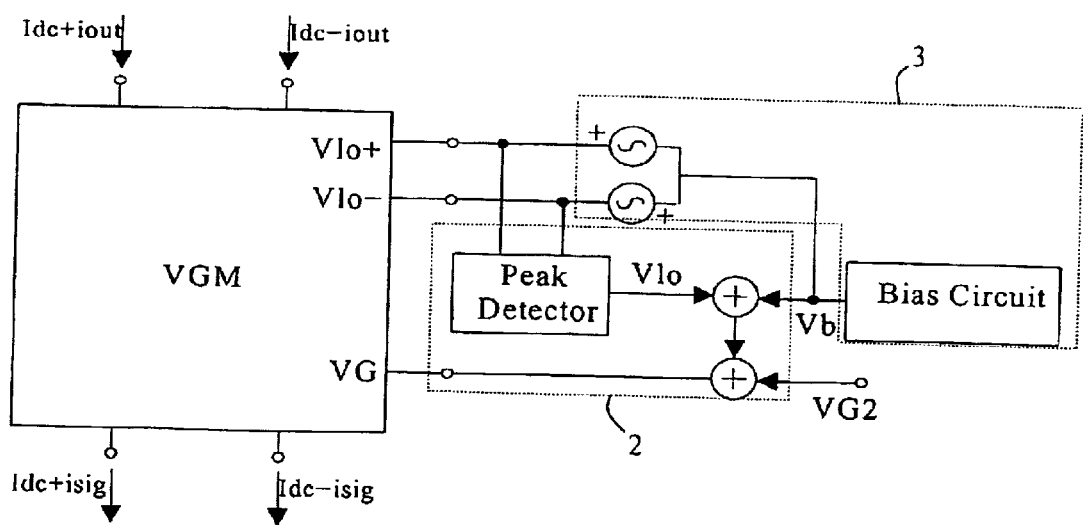
FIG. 2 depicts a variable gain mixer using a peak detector according to the prior art.

The gain variation that is produced in the mixer of the invention of FIG. 3, as in the prior art modulator of FIG. 2, is ideally an exponential function of the external command VG2. However, the function of the gain variation is roughly exponential.

Should the mixer of the invention be used in applications that require a highly precise variation of the gain with the external command VG2, according to an exponential law, the mixer of the invention of FIG. 3 may be provided with appropriate compensation circuits that modify the control of the VGM. This can be done, for instance, by the use of a pre-distortion circuit that generates the control voltage VG to be input to the VGM by compensatively distorting the differential signal produced by the amplifier A2.

Figure 4:
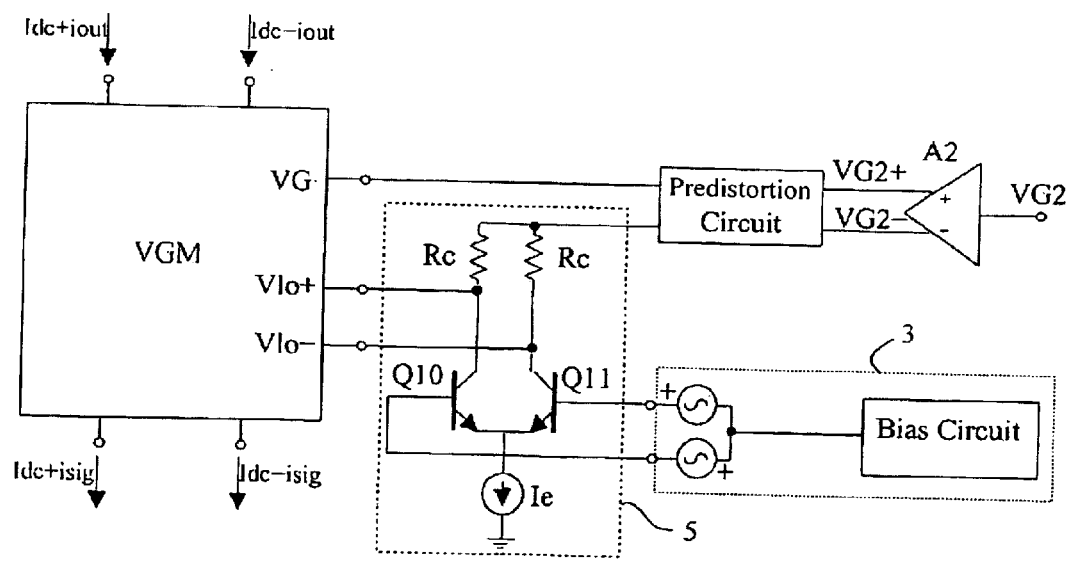
FIG. 4 depicts a second embodiment of the mixer provided in FIG. 3, which includes a pre-distortion circuit according to the invention.
Figure 5:
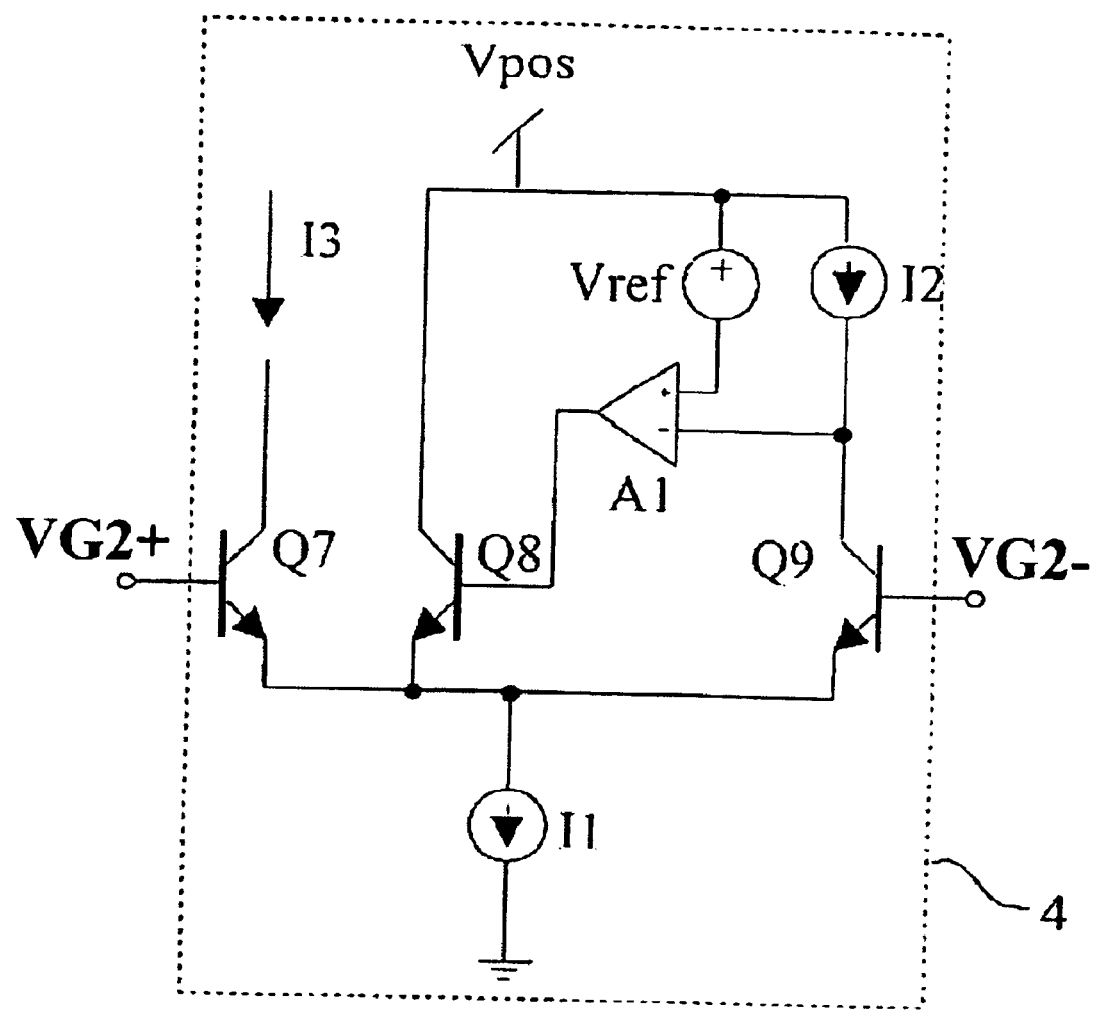
FIG. 5 depicts an auxiliary control circuit that may be used as a pre-distortion circuit according to the invention.

Such an approach is implemented in the mixer of the invention depicted in FIG. 4, which comprises a pre-distortion circuit PREDISTORTION_CIRCUIT for the control voltage VG of the VGM. A suitable pre-distortion circuit for obtaining a highly precise exponential gain variation may include an auxiliary control circuit as the one disclosed in the above cited prior art reference and depicted in FIG. 5.

A differential voltage (VG2$^+$, VG2$^-$) is applied to the bases of the input transistors Q7 and Q9. A constant collector current provided by the current generator I2 flows in the transistor Q9. Also, the base emitter voltage of the transistor Q9 is constant. In these conditions, the collector current of the transistor Q7 may be calculated with the following equation:

$$I3 = K \cdot I2 \cdot e^{\frac{VG2^+ - VG2^-}{V_T}} \quad (3)$$

where K is the ratio between the emitter areas of transistors Q7 and Q9.

Therefore, the variation of the collector current of transistor Q7 is an exponential function of the voltage (VG2$^+$−VG2$^-$) because the current I2 is constant. The current I1-I2-I3 flows through transistor Q8, and the amplifier A1 prevents saturation of transistor Q9 by regulating the collector voltage of transistor Q9 to Vpos−Vref. Such an auxiliary control circuit 4 is included in the circuit of the mixer of the invention depicted in FIG. 6.

Figure 1:
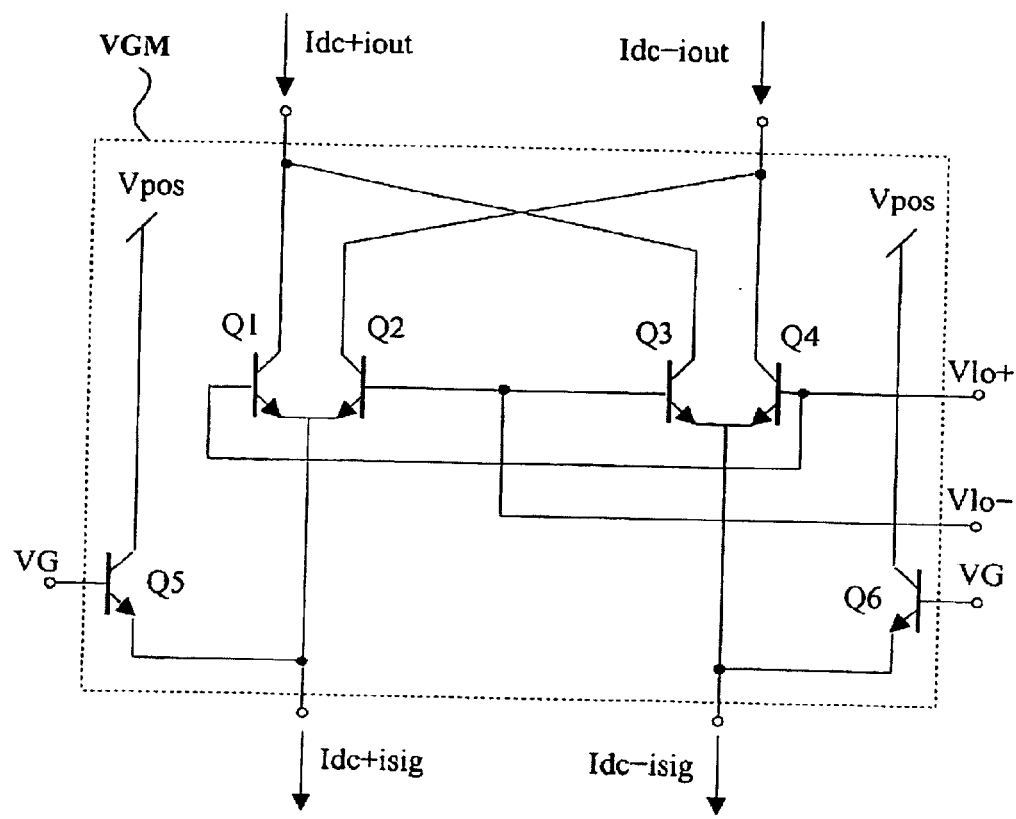
FIG. 1 depicts a variable gain mixer according to the prior art.

The mixer 7 is a modified embodiment of the VGM of FIG. 1, from which it differs because of the presence of a pair of identical auxiliary transistors Q12 and Q13 acting as current diverters for the transistors Q5 and Q6. The bases of transistors Q5 and Q6 are coupled to the control voltage VG2$^-$, which is one of the two differential outputs of the amplifier A2. The bases of transistors Q12 and Q13 are, on the contrary, coupled to the auxiliary voltage VGaux output of the amplifier A1 of the circuit 4. The base of the transistor Q7 of circuit 4 is coupled to the other output VG2$^+$ of the amplifier A2, and to the resistors R$_c$ of the amplifier 5, preferably by interposing a buffer stageBUFFER therebetween. Such a buffer stage provides the current I$_e$ that circulates in the differential amplifier 5 without loading the amplifier A2.

The external gain variation command VG2 is converted by the amplifier A2 in the differential signal VG2$^+$, VG2$^-$. The voltage VG2$^-$ is input to both the auxiliary control circuit 4 and the mixer 7. The voltage VG2$^+$ is input to the circuit 4, and through the bufferBUFFER, to the differential amplifier 5.

In order to attenuate the output current signal i$_{out}$ of circuit 7 according to an exponential law with a high precision, the current i$_{out}$ must vary as the current I3 of the auxiliary control circuit 4. This occurs when the following equations are verified:

$$\frac{Idc}{I1} = \frac{A_e(Q1)}{A_e(Q7)} = \frac{A_e(Q12)}{A_e(Q8)} = \frac{A_e(Q5)}{A_e(Q9)} = N \quad (4)$$

$$Q1=Q2=Q3=Q4 \quad (5)$$

Equation (4) states that the transistors of the mixer 7 must be an N:1 scaled replica of the transistors of the auxiliary control circuit 4. Using the above described architecture, the signal i$_{sig}$ of the mixer 7 cannot interfere with the auxiliary control circuit 4, thus compromising its stability that occurs when the current of the transistor Q8 is very small. In these conditions, the response characteristic of the circuit 4 becomes rather slow, and should a signal i$_{sig}$ be present, it would undergo to a significant distortion.

Figure 6:
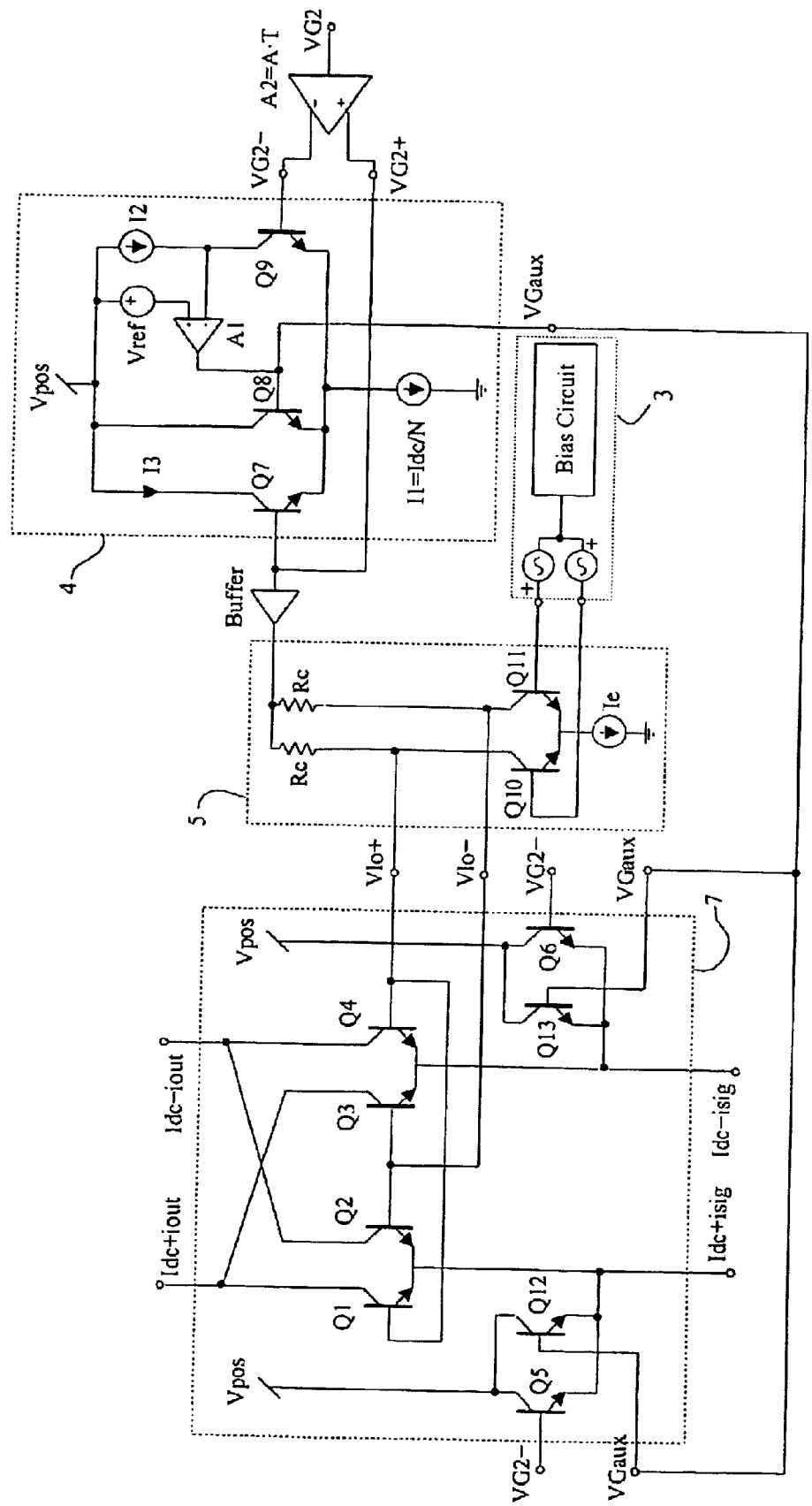
FIG. 6 is a detailed circuit diagram of a mixer comprising an auxiliary control circuit according to the invention

It must be observed that the gain of the mixers of the invention depicted in FIGS. 3, 4 and 6 are temperature dependent, because in the equations (1) and (3) there appears the thermal voltage $V_T$=k·T/q, wherein T is the absolute temperature and q is the electron charge. Consequently, the gain of the mixer depends from the control voltage and from the temperature.

The problem of temperature dependency is overcome by forming the amplifier A2 of the mixers of the invention of FIGS. 3, 4 and 6 such that its gain varies proportionally with temperature:

$$A2=A2(T)=A \cdot T \tag{6}$$

Substituting equation (4) in equation (3) provides:

$$I3 = K \cdot I2 \cdot e^{\frac{VG2^+ - VG2^-}{V_T}} = K \cdot I2 \cdot e^{\frac{A \cdot T \cdot VG2}{\frac{k \cdot T}{q}}} = K \cdot I2 \cdot e^{\frac{A \cdot q \cdot VG2}{k}} \tag{7}$$

In conclusion, the modulator proposed in FIG. 6 has the following advantages. The gain of the mixer 7 varies exponentially and independently from temperature. The auxiliary control circuit 4 is isolated from the signal $i_{sig}$ to be amplified. There is good isolation between the input signal $i_{sig}$ and the output signal $i_{out}$ of the mixer 7 because they have different frequencies. This makes it possible to provide for relatively large gain variations. Additional advantages include the coupling between the auxiliary control circuit 4 and the mixer 7 with little complexity by merely interposing a buffer and the differential amplifier 5, and no external components are required.

That which is claimed is:

1. An exponentially variable gain mixer circuit comprising:
   an oscillating circuit generating an alternating differential signal;
   a correction circuit connected to said oscillating circuit and comprising
      a first amplifier receiving an external gain variation command and generating a differential output signal that includes a control voltage and a bias voltage, and
      a differential amplifier receiving the alternating differential signal and generating a differential modulation signal, said differential amplifier being referred to the bias voltage; and
   a variable gain mixer receiving an input differential signal and generating an amplified differential signal as a function of the differential modulation signal and the control voltage.

2. An exponentially variable gain mixer circuit according to claim 1, wherein said first amplifier has a gain that varies proportionally with temperature.

3. An exponentially variable gain mixer circuit according to claim 1, further comprising a pre-distortion circuit receiving the control voltage and the bias voltage, and providing an auxiliary voltage to said variable gain mixer and the bias voltage to said differential amplifier.

4. An exponentially variable gain mixer circuit according to claim 3, wherein said variable gain mixer comprises:
   first and second differential stages connected together and being biased with a bias current, said first and second differential stages respectively providing first and second signals of the amplified differential signal;
   a first regulation transistor connected to said first differential stage for regulating the first signal, said first regulation transistor being controlled by the control voltage;
   a first auxiliary transistor connected in parallel to said first regulation transistor, said first auxiliary transistor being controlled by the auxiliary voltage;
   a second regulation transistor connected to said second differential stage for regulating the second signal, said second regulation transistor being controlled by the control voltage; and
   a second auxiliary transistor connected in parallel to said second regulation transistor, said second auxiliary transistor being controlled by the auxiliary voltage.

5. An exponentially variable gain mixer circuit according to claim 4, wherein said first and second differential stages form a Gilbert cell; wherein said first and second differential stages are identical; wherein said first and second regulation transistors are identical; and wherein said first and second auxiliary transistors are identical.

6. An exponentially variable gain mixer circuit according to claim 4, wherein said pre-distortion circuit comprises an auxiliary control circuit comprising:
   a first current generator;
   first and second input transistors connected in series to said first current generator at a common current node, said first input transistor being controlled by the control voltage and said second input transistor being controlled by the bias voltage;
   a second current generator connected between a supply node and said first input transistor;
   an operational amplifier having a first input for receiving a reference voltage and a second input connected to said second current generator, and an output for providing the auxiliary voltage; and
   a third transistor connected in parallel to said second input transistor, said third transistor being controlled by the auxiliary voltage.

7. An exponentially variable gain mixer circuit according to claim 6, wherein said first differential stage comprises a transistor; and wherein a ratio between the bias current and a current provided by said first current generator is equal to a ratio between emitter areas of said transistor of said first differential stage and said second input transistor; a ratio between emitter areas of said first auxiliary transistor and said third transistor; and a ratio between emitter areas of said first regulation transistor and said first input transistor.

8. An exponentially variable gain mixer circuit according to claim 6, further comprising a buffer stage connected between said differential amplifier and said auxiliary control circuit, said buffer stage receiving the bias voltage.

9. An exponentially variable gain mixer circuit comprising:
   an oscillating circuit generating an alternating differential signal;
   a correction circuit connected to said oscillating circuit and comprising
      a first amplifier receiving an external gain variation command and generating a differential output signal that includes a control voltage and a bias voltage, and
      a second amplifier receiving the alternating differential signal and the bias voltage, and generating a differential modulation signal; and
   a pre-distortion circuit receiving the control voltage, and generating an auxiliary voltage;
   a variable gain mixer receiving an input differential signal and generating an amplified differential signal as a function of the differential modulation signal and the control voltage, said variable gain mixer comprising
      first and second differential stages connected together and respectively providing first and second signals defining the amplified differential signal,
      a first regulation transistor connected to said first differential stage for regulating the first signal, said first regulation transistor being controlled by the control voltage,
      a first auxiliary transistor connected in parallel to said first regulation transistor, said first auxiliary transistor being controlled by the auxiliary voltage, a second regulation transistor connected to said second differential stage for regulating the second signal, said second regulation transistor being controlled by the control voltage, and a second auxiliary transistor connected in parallel to said second regulation transistor, said second auxiliary transistor being controlled by the auxiliary voltage.

10. An exponentially variable gain mixer circuit according to claim 9, wherein said first amplifier has a gain that varies proportionally with temperature.

11. An exponentially variable gain mixer circuit according to claim 9, wherein said first and second differential stages form a Gilbert cell; wherein said first and second differential stages are identical; wherein said first and second regulation transistors are identical; and wherein said first and second auxiliary transistors are identical.

12. An exponentially variable gain mixer circuit according to claim 9, wherein said pre-distortion circuit comprises:

a first current generator;

first and second input transistors connected in series to said first current generator at a common current node, said first input transistor being controlled by the control voltage and said second input transistor being controlled by the bias voltage;

a second current generator connected between a supply node and said first input transistor;

an operational amplifier having a first input for receiving a reference voltage and a second input connected to said second current generator, and an output for providing the auxiliary voltage; and a third transistor connected in parallel to said second input transistor, said third transistor being controlled by the auxiliary voltage.

13. An exponentially variable gain mixer circuit according to claim 12, wherein said first and second differential stages are biased with a bias current and said first differential stage comprises a transistor; and wherein a ratio between the bias current and a current provided by said first current generator is equal to a ratio between emitter areas of said transistor of said first differential stage and said second input transistor; a ratio between emitter areas of said first auxiliary transistor and said third transistor; and a ratio between emitter areas of said first regulation transistor and said first input transistor.

14. An exponentially variable gain mixer circuit according to claim 12, further comprising a buffer stage connected between said second amplifier and said pre-distortion circuit, said buffer stage receiving the bias voltage.

15. A method for generating an amplified differential signal using an exponentially variable gain mixer circuit, the method comprising:

generating an alternating differential signal;

providing an external gain variation command to a first amplifier, and generating a differential output signal from the first amplifier based upon the external gain variation command, the differential output signal including a control voltage and a bias voltage;

providing the bias voltage and the alternating differential signal to a second amplifier, and generating a differential modulation signal from the second amplifier; and providing an input differential signal to a variable gain mixer, and generating an amplified differential signal as a function of the differential modulation signal and the control voltage.

16. A method according to claim 15, wherein the first amplifier has a gain that varies proportionally with temperature.

17. A method according to claim 15, wherein the exponentially variable gain mixer circuit further comprises a pre-distortion circuit receiving the control voltage and the bias voltage, and providing an auxiliary voltage to the variable gain mixer and the bias voltage to the second amplifier.

18. A method according to claim 17, wherein the variable gain mixer comprises:

first and second differential stages connected together and being biased with a bias current, the first and second differential stages respectively providing first and second signals of the amplified differential signal;

a first regulation transistor connected to the first differential stage for regulating the first signal, the first regulation transistor being controlled by the control voltage, a first auxiliary transistor connected in parallel to the first regulation transistor, the first auxiliary transistor being controlled by the auxiliary voltage, a second regulation transistor connected to the second differential stage for regulating the second signal, the second regulation transistor being controlled by the control voltage, and a second auxiliary transistor connected in parallel to the second regulation transistor, the second auxiliary transistor being controlled by the auxiliary voltage.

19. A method according to claim 18, wherein the first and second differential stages form a Gilbert cell; wherein the first and second differential stages are identical; wherein the first and second regulation transistors are identical; and wherein the first and second auxiliary transistors are identical.

20. A method according to claim 18, wherein the pre-distortion circuit comprises:

a first current generator;

first and second input transistors connected in series to the first current generator at a common current node, the first input transistor being controlled by the control voltage and the second input transistor being controlled by the bias voltage;

a second current generator connected between a supply node and the first input transistor;

an operational amplifier having a first input for receiving a reference voltage and a second input connected to said second current generator, and an output for providing the auxiliary voltage; and a third transistor connected in parallel to the second input transistor, the third transistor being controlled by the auxiliary voltage.

21. A method according to claim 20, wherein the first differential stage comprises a transistor; and wherein a ratio between the bias current and a current provided by the first current generator is equal to a ratio between emitter areas of the transistor of the first differential stage and the second input transistor; a ratio between emitter areas of the first auxiliary transistor and the third transistor; and a ratio between emitter areas of the first regulation transistor and the first input transistor.

22. A method according to claim 17, further comprising a buffer stage connected between the second amplifier and the pre-distortion circuit, the buffer stage receiving the bias voltage.

* * * * *